United States Patent [19]
Kobayashi et al.

[11] Patent Number: 6,029,264
[45] Date of Patent: Feb. 22, 2000

[54] SYSTEM AND METHOD FOR ERROR CORRECTING A RECEIVED DATA STREAM IN A CONCATENATED SYSTEM

[75] Inventors: Hisashi Kobayashi; Jan Bajcsy, both of Princeton, N.J.

[73] Assignee: The Trustees of Princeton University, Princeton, N.J.

[21] Appl. No.: 08/840,383

[22] Filed: Apr. 28, 1997

[51] Int. Cl.[7] .................................................. H03M 13/00
[52] U.S. Cl. ............................................................ 714/755
[58] Field of Search ...................................... 714/755, 752; 371/37.4, 43.7

[56] References Cited

U.S. PATENT DOCUMENTS

| | | | |
|---|---|---|---|
| 3,622,986 | 11/1971 | Tang et al. .............................. | 340/146.1 |
| 5,721,745 | 2/1998 | Hladik et al. .......................... | 371/37.4 |

OTHER PUBLICATIONS

Error–Correcting Codes, Second Ed., Peterson et al., pp. 2–3–8.

Prentice–Hall Series in Computer Applications in Electrical Engineering, Shu Lin et al.., pp. 274–280, "Error Control Coding: Fundamentals and Applications".

IBM Journal of Research and Development, Jan. 1971, vol. 15 H. Kobayashi, pp. 64–74, "Application of Probabilistic Decoding to Digital Magnetic Recording Systems".

Kluwer Academic Publishers, Jan W. M. Bergmans, pp. 316–323, "Digital Baseband Transmission and Recording".

IEEE Communications Magazine, Apr. 1986–vol. 24, No. 4, Carl–Erik Sundberg, pp. 26–38, "Continous Phase Modulation".

IEEE Transactions on Communication Technology, vol. COM–19, No. 4 Aug. 1971, H. Kobayashi et al., pp. 467–477, "On Decoding of Correlative Level Coding Systems with Ambiguity Zone Detection".

IEEE Transactions on Communication Technology, vol. COM–19, No. 6 Dec. 1971, H. Kobayashi, pp. 1087–1100, "A Survey of Coding Schemes for Transmission or Recording of Digital Data".

IEEE Transactions on Information Theory, vol. IT–17, No. 5, Sep. 1971, H. Kobayashi, pp. 586–594, "Correlative Level Coding and Maximum–Likelihood Decoding".

IEEE Transactions on Communications, vol. 44–No. 10, Oct. 1996, C. Berrou et al., pp. 1261–1270, "Near Optimum Error Correcting Coding and Decoding: Turbo–Codes".

Xiao–an Wang, Stephen B. Wicker, A Soft–Output Decoding Algorithm for concatenated System, IEEE, pp. 543–553, Feb. 3, 1996.

*Primary Examiner*—Albert De Cady
*Assistant Examiner*—Shelly A Chase

[57] ABSTRACT

A received signal is first converted into a digital sequence that may contain "erasures" (or ambiguity symbols) as well as errors. Then iterative decoding is applied in order to eliminate or reduce the erasures. This decoding procedure works effectively with the associated transmitter that adopts a concatenation of an outer coder, a permutation and an inner coder. The principal of the invention is also applicable to a system in which the inner coder is replaced by a "digital modulator" that introduces some constraint, or a channel that introduces some memory such as partial response signaling, intersymbol interference or multipath propagation. The invention can be applied to many existing systems while maintaining "backward compatibility" in the sense that the transmitter side need not be modified.

12 Claims, 14 Drawing Sheets

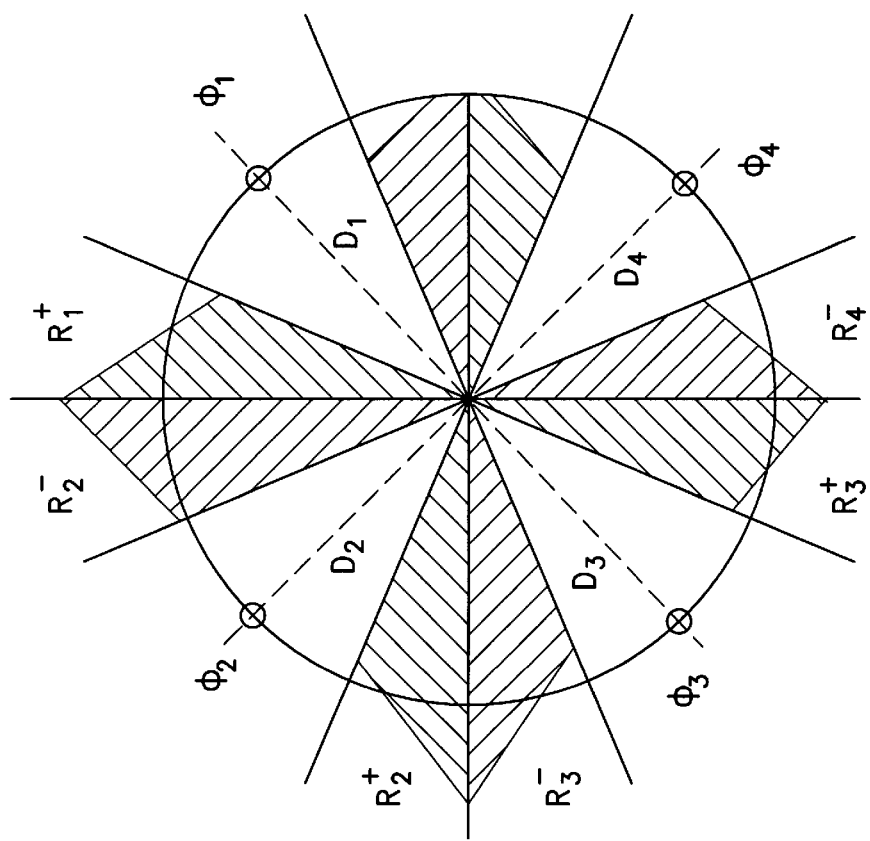
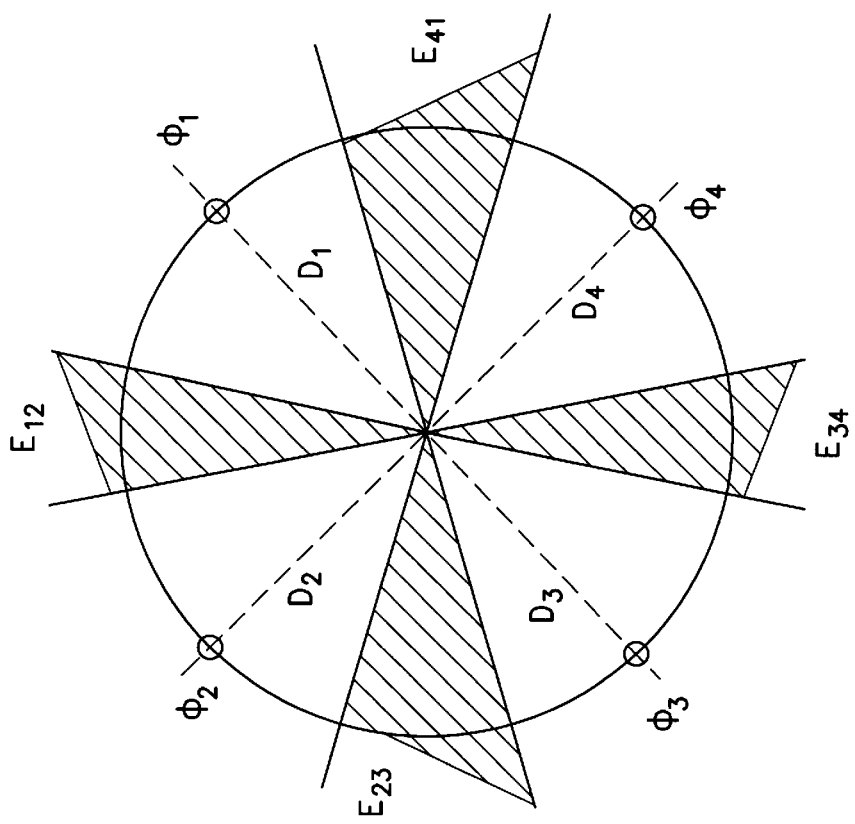
FIG. 10B
FIG. 10A

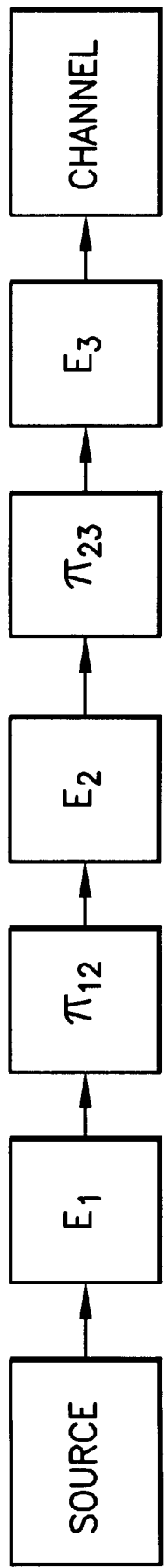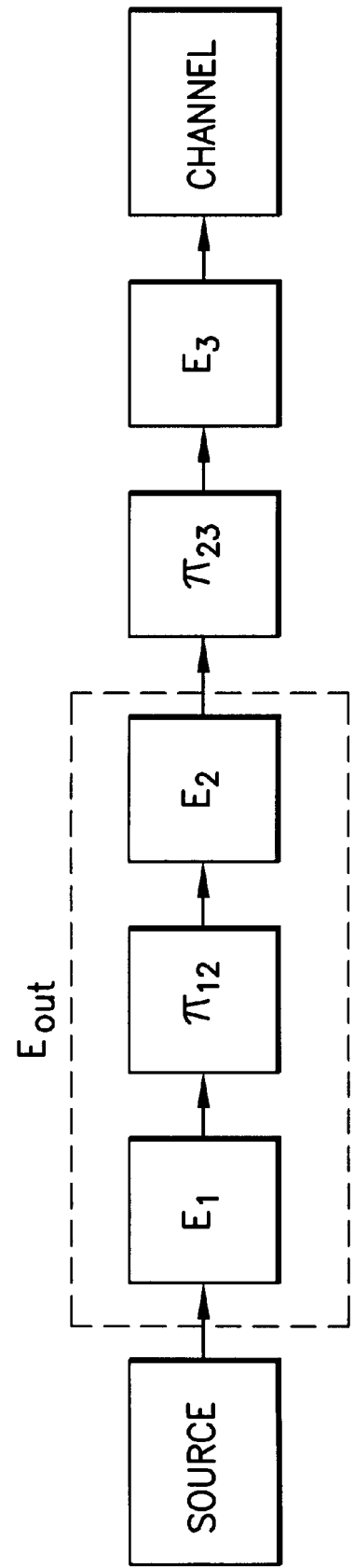
FIG.11A
FIG.11B

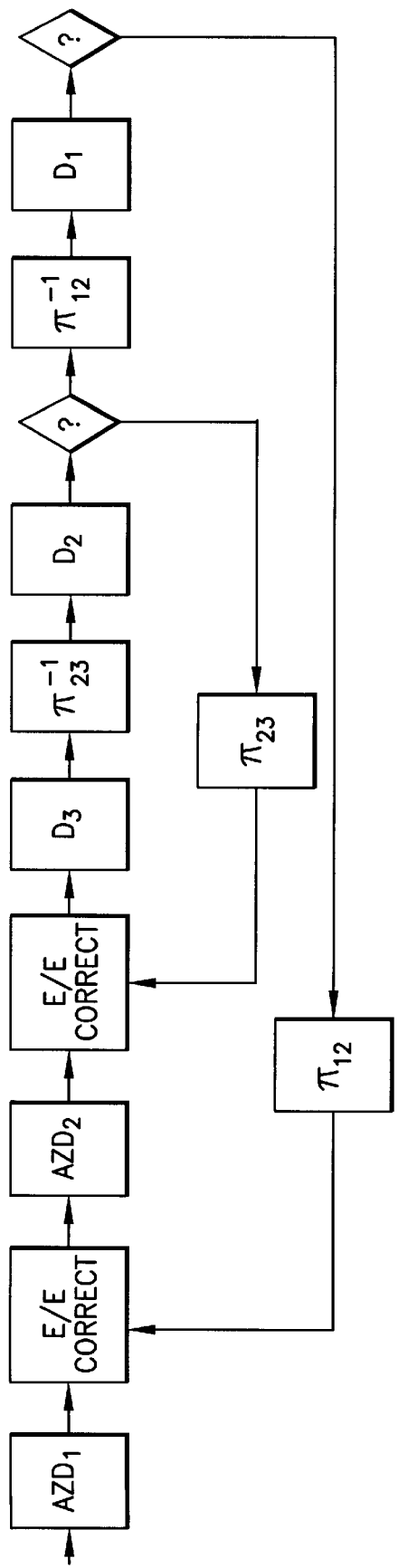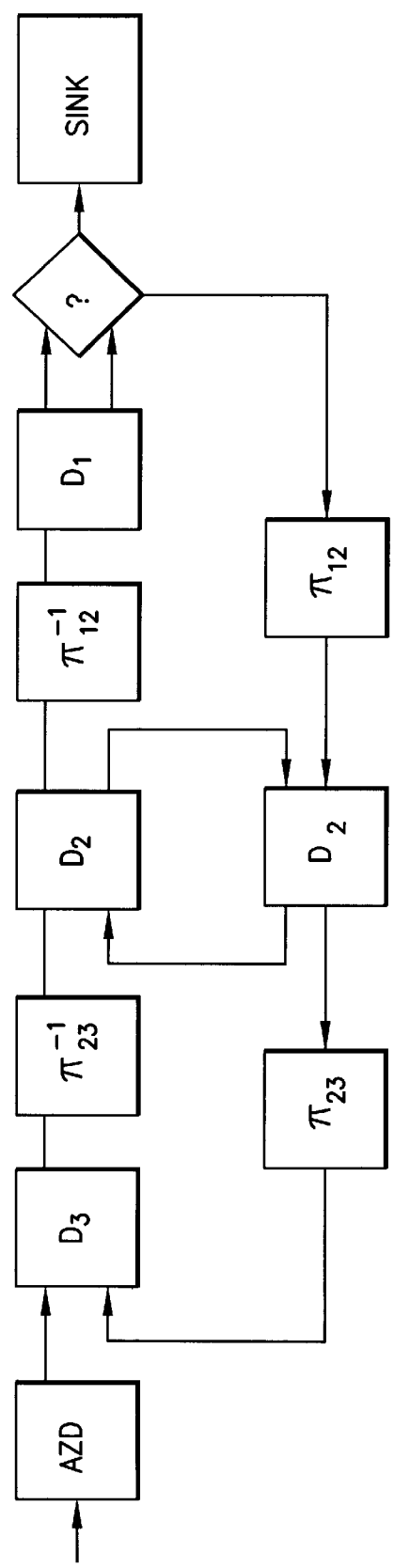
FIG.12C
FIG.13

SYSTEM AND METHOD FOR ERROR CORRECTING A RECEIVED DATA STREAM IN A CONCATENATED SYSTEM

FIELD OF THE INVENTION

This invention relates to error correction of a received data stream and more particularly to an error correction method and system which employs ambiguity zone detection, permutation and inverse permutation and iterative processing to perform the error correction action.

BACKGROUND OF THE ART

A primary objective of any digital communication system is to transmit information at the maximum possible rate and receive it with minimum errors or distortion. Similarly, a main design objective of data storage system is to allow the system to store information with the maximum possible density and to retrieve it with the least possible errors. A variety of error control coding schemes, channels with constraint, and digital modulation with constraint have been devised to improve data transmission and recording systems.

CONCATENATED ENCODING AND DECODING SYSTEMS

Error control codes such as block codes and convolutional codes are usually applied to digital sequences for the purpose of coping with errors which may happen in bursts as well as randomly. Basically, error control coding expands the information sequence by adding additional bits for error correction/detection purposes. The encoded sequence then contains some constraint or redundancy. Such constraint is then exploited by the receiver to identify possible errors that may exist in the received sequence. For example, if the received sequence does not satisfy parity-check equations, then the receiver detects the existence of some errors and, in some cases, can correct them.

In order to achieve a higher performance, a concatenation of two error correcting codes is sometimes adopted. FIG. 1 depicts such a concatenated encoding system and the corresponding decoding system. Here the term "inner encoder" is used in the sense that the inner encoder is closer to the communication channel. Hence a subsystem including an inner encoder, the communication channel and an inner decoder, is often called an "outer channel". The outer encoder therefore sees the outer channel as the effective channel.

An example is to use a block code (e.g., a Reed-Solomon code) as the outer code and a convolutional code as the inner code. An "interleaver" is often placed between the two encoders, because when the inner decoder makes erroneous decisions, it tends to create bursts of errors due to the nature of the convolutional code. FIG. 2 depicts such a concatenated system. An interleaver is an example of a device which permutes a data stream in a manner which is reversible. An example of an interleaver is shown in FIG. 2a, with bits 0–63 being serially loaded into adjacent rows. An output is obtained by sequentially accessing adjacent columns of bits. The interleaving action disperses adjacent bit values and prevents a burst error from affecting a sequential run of bits in the original data stream.

By having the interleaver in front of the outer channel, the outer encoder and decoder do not have to deal with long bursts of errors. (See e.g., S. Lin and D. J. Costello, Jr., Error Control Coding:Fundamentals and Applications, Prentice-Hall, 1983. pp. 535–538.) The type of system represented in FIG. 2 is closely related to the invention to be described below, in that a receiver incorporating the invention can be applied to the illustrated class systems without changing the transmitter side hence, as will be seen, the invention is backward compatible with such existing systems.

CHANNELS WITH CONSTRAINT

The notion of concatenated system can be generalized to a system in which the inner encoder is not a conventional error correcting encoder (such as a block code or convolutional code), but is a special type of signaling scheme or a channel with some constraint or memory. (See e.g., H. Kobayashi, "A Survey of Coding Schemes for Transmission or Recording of Digital Data", IEEE Trans. Communication Technology, vol. COM-19, pp. 1087–1100, December 1971).

Intersymbol interference (ISI) and/or interchannel interference (ICI) due to channel distortion, may sometimes be predominant factors in limiting performance and reliability. A number of coding techniques have been developed to reduce adverse effects due to these factors. Partial-response channel coding is well recognized as a bandwidth-efficient transmission technique and can be viewed as a technique to shape the signal spectrum by introducing a controlled amount of ISI. An optimal decoding structure for a partial-response channel is known as maximum-likelihood (ML) decoding (See e.g., H. Kobayashi, "Application of Probabilistic Decoding to Magnetic Recording Systems", IBM J. of Res. and Develop. Vol. 15, Jan. 1971, pp. 64–74., and H. Kobayashi, "Correlative Level Coding and Maximum-Likelihood Decoding", IEEE Trans. Information Theory, Vol. IT-17, Sep. 1971, pp. 586–594.).

A system with partial-response channel coding and maximum likelihood decoding has become popular in recent years and is often referred to as a PRML system (see e.g., J. W. M. Bergmans, "Digital Baseband Transmission and Recording", Kluwer Academic Publishers, 1996).

Another class of codes, often used in digital recording, is run-length limited codes, denoted (d,k)-limited codes. The integer parameters d and k represent the minimum and maximum numbers of runs of either 0's or 1's that are allowed in the encoded sequence. The lower bound d is chosen from the ISI consideration, and the upper bound k is set to insure clock synchronization capability at the receiver side.

Both partial-response channels and run-length limited codes can be viewed as techniques that introduce some constraints into the digital sequence to be transmitted. Similarly, a channel with ISI and/or multipath fading introduces some memory in the received sequence. Such constraints or memory should be exploited by the receiver to identify possible errors or biases that may exist in the received sequence. FIG. 3 shows a generalized concatenated system where the inner encoder represents a channel with some constraint.

DIGITAL MODULATION WITH CONSTRAINT

Techniques similar to partial-response signaling have been developed in digital modulation schemes. One important class of such modulation techniques is known as continuous phase modulation (CPM) or continuous envelope coded modulation (see e.g., C. E. Sundberg, "Continuous Phase Modulation", IEEE Communications Magazine, April 1986, pp. 25–38). Here, some constraint is introduced in the modulated signal, because the phase values that the modulated signal is allowed to take are limited to a subset of the set of phase values defined for the modulation system. An example of CPM is MSK (minimum shift keying) in which the phases that the modulated signal is permitted to take at a given symbol time are only the phases adjacent to the previous symbol phase.

Another class of digital phase modulation techniques with similar properties is those that use differential precoding of the data. In this case, the correlation is caused by the preceding and consequent modulation. An example of differentially precoded digital phase modulation is π/4-QDPSK (π/4-shifted quadrature differential phase shift keying).

These modulation techniques can be viewed as a means to minimize the adverse effects of unknown/time-varying channel attenuation, fading and nonlinear power amplification, while still allowing bandwidth efficient communication. Since the amplitude of transmitted signals contains no information, one can reproduce the original information even if the amplitude has been significantly distorted. These classes of digital modulation techniques have come to be predominantly used in wireless communication systems. FIG. 4 depicts a concatenated system in which the inner encoder is a modulator with some constraint.

CODED MODULATION

Instead of concatenating two error control codes, an error control code may be concatenated with digital modulation. A trellis-coded modulation (TCM) is a well-known example in which a convolutional code and digital-phase modulation are combined. The receiver can correct most errors effectively, since the receiver can exploit the constraint that the received phase sequence must satisfy. This is because a particular method (called set partitioning) is used to map the convolutional code sequence into the amplitudes and/or phases of the modulated signal. A concatenated system with TCM is schematically shown in FIG. 5.

An optimal decoding structure for continuous phase modulation, precoded digital phase modulation and TCM is maximum-likelihood (ML) decoding, similar to that originally derived for convolutional codes (i.e., Viterbi decoding) and for partial-response systems.

ERASURES

A receiver may be designed to decide that a symbol should be erased when it is received ambiguously. Suppose that a channel input is binary, i.e., 0 or 1. When a received symbol is corrupted by strong noise or interference and its value is near the threshold between 0 and 1, then the receiver may opt not to make a hard decision regarding the value of the symbol, and labels it as "e", which stands for an erasure. To implement an erasure, a quantizer is required with additional threshold(s), see FIG. 6a). When the input is binary, the output with erasure option can be represented by two bits, e.g., by (00), (01) and (10) to denote "0", "e" and "1", respectively.

A In coding theory a binary erasure channel (BEC) has been well studied (see e.g., W. W. Peterson and E. J. Weldon, Jr., "Error Correcting Codes", 2nd Edition, MIT Press, 1994. p. 8). The channel characteristic of a BEC is shown in FIG. 6b, where the possible errors are limited to erased digits. In other words 0 is never mistaken as 1 and vice versa. Kobayashi and Tang, "On Decoding of Correlative Level Coding Systems with Ambiguity Zone", IEEE Trans. Communications, Vol. COM-19, pp. 467–477, Aug. 1971) generalized the erasure concept and applied it to partial-response systems. They showed that decoding with the generalized erasure, which they termed ambiguity zone decoding can achieve a near-optimum performance, while retaining decoding complexity at a minimal level.

As discussed above, a large class of digital communication or recording systems can be viewed as concatenated systems in which each building block may be an error control encoder, a modulator with constraints, or a channel with constraints. The conventional method of receiving such signals is to perform the inverse operations of the transmitter's building blocks, in the reverse order. In other words, building blocks at the receiver are an inner decoder, a de-interleaver and an outer decoder. The inner decoder attempts to do its best in correcting errors and delivers the resultant output to the outer decoder. Such a decoding procedure may be called a "one-path" decoding method. Such a one-path method is still susceptible to being unable to correct many error states, notwithstanding a general ability to correct for many error conditions.

Accordingly, it is an object of the invention to improve error correction performance of a receiver system which receives digital data over a noisy communication channel (e.g., radio channel, cable channel).

It is another object of the invention to improve error correction performance of a system which retrieves data from a memory (e.g., digital magnetic recording disk) which is subject to random/burst noise or medium defects.

SUMMARY OF THE INVENTION

A method error corrects a received data stream in a general concatenated system in which a plurality of encoding algorithms and/or entities which impose a constraint are connected either in series or in parallel or both. The method includes the steps of: (a) sampling signal levels in the received data stream and assigning discrete data values to sampled signal levels falling in non-ambiguous amplitude and/or phase ranges and assigning ambiguity values to sampled signal levels falling within an ambiguity range of amplitude and/or phase values, and outputting a quantized data stream comprising the discrete data values and ambiguity values; (b) decoding and error correcting data values making up the quantized data stream to create an error-corrected data stream, the decoding including plural decoding actions for decoding data that has been encoded or subjected to a constraint by the plural concatenated entities; c) correcting data values and ambiguity values in the quantized data stream by substitution of corrected data values from the error corrected data stream into corresponding data values in the quantized data stream, to thereby create a revised data stream; and d) iteratively subjecting the revised data stream, both as is and as further revised, to steps b) and c) to improve an error correction state of the revised data stream. In a preferred embodiment, the data making up the received data stream has been subjected to a permutation action to time-wise separate original contiguous data values. The method subjects the quantized data stream to an inverse permutation action in producing the error-corrected data stream and further re-permutes the error-corrected data stream (in step (c)) to return it to a format identical to that of the quantized data stream before the substitution is performed.

BRIEF DESCRIPTION OF THE DRAWINGS

FIGS. 10a and 10b are charts which illustrate four phase modulation with four ambiguity zones (FIG. 10a) and with eight ambiguity zones (FIG. 10b).

FIG. 11a is a block diagram of a concatenated system incorporating the invention which employs three encoders.

FIG. 11b is a block diagram of a concatenated system equivalent to that shown in FIG. 11a which employs two encoders.

FIG. 11d is a block diagram of a concatenated system employing an expanded encoder for the three encoder system of FIG. 11a.

FIG. 12a is a block diagram of a concatenated system employing an equivalent two encoder system for the three encoder system of FIG. 11a.

FIG. 12b is a block diagram of a concatenated system employing an iterative decoder for the equivalent two encoder system of FIG. 12a.

FIG. 12c is a block diagram of a concatenated system employing an expanded decoder for the three encoder system of FIG. 11a.

FIG. 13 is a block diagram of a concatenated system employing an iterative three decoder system for the three encoder system of FIG. 11a, with one feedback loop.

FIG. 14b is a block diagram of an iterative decoder for the two-parallel concatenated system of FIG. 14a.

DETAILED DESCRIPTION OF THE INVENTION

Iterative Decoding with Ambiguity Zone Detection (AZD) and Permutation

Figure 1:
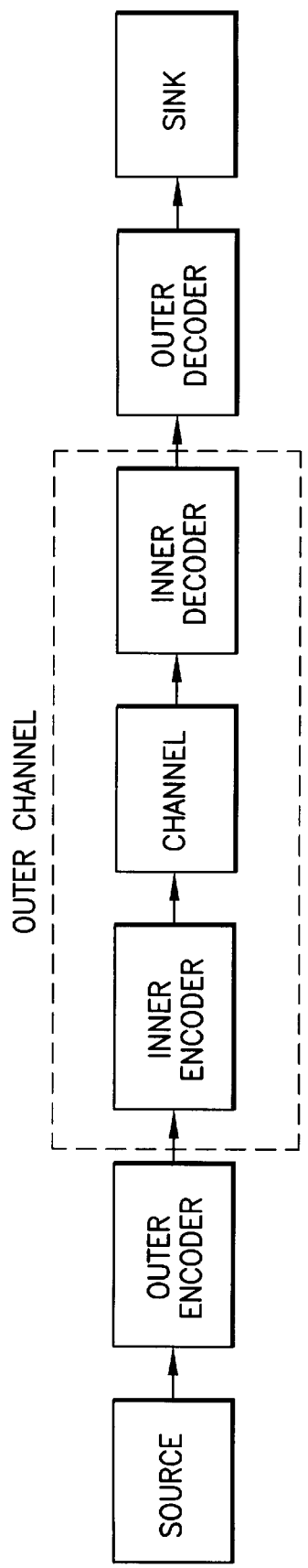
FIG. 1 is a block diagram of a prior art concatenated system for decoding and error correcting a received data stream.
Figure 7A:
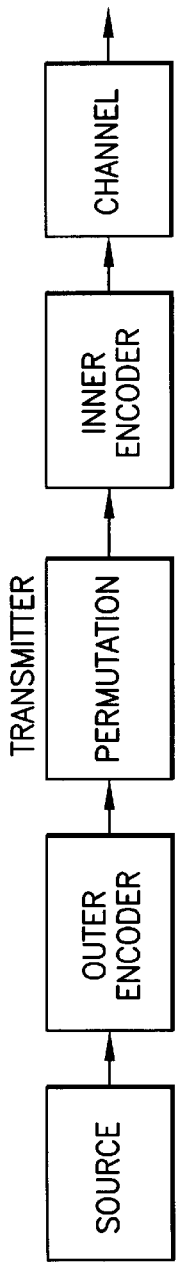
FIG. 7a is a block diagram of a transmitter portion of a concatenated system for decoding and error correcting a received data stream, which systemincorporates the invention hereof.
Figure 7B:
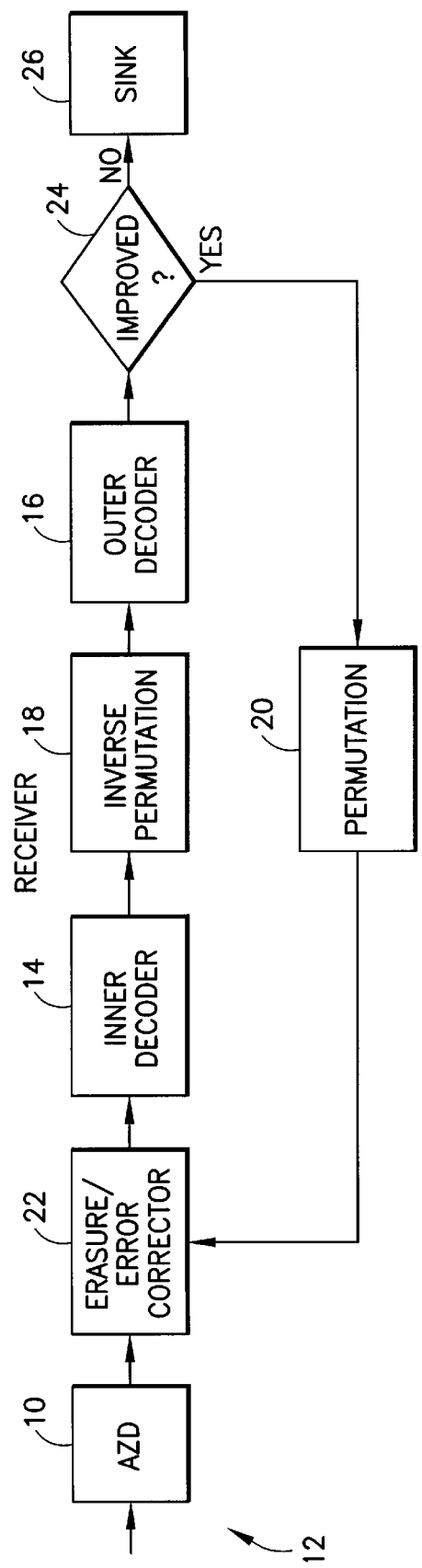
FIG. 7b is a block diagram of a receiver portion of a concatenated system for decoding and error correcting a received data stream, which system incorporates the invention hereof.

A system incorporating the invention is schematically shown in FIG. 7. The transmitter side is almost the same as any of the concatenated systems discussed above, except that a "permutation" module has been inserted, for generalization purposes, (instead of the interleaver) between the outer and inner encoders. A carefully designed permutation module can improve the system more than a conventional interleaver, however it is to be understood that an interleaver is within the ambit of a permutation module and is a special and simple type of permutation module. Similarly, a concatenated system without an interleaver (FIG. 1) also can embody the invention, as no interleaver is equivalent to insertion of an "identity permutation". Thus, the invention can be applied to a large class of systems with little or no modification at the transmitter side.

The invention places an AZD (ambiguity zone detector) 10 at the receiver front end 12. An AZD is a threshold detector (or quantizer) which assigns "erasure symbols" to those digits that fall in ambiguous zones (see the example described below). The output sequence from AZD 10 is then processed by passing it to concatenated decoders 14 an 16 which are connected in a loop. Between decoders 14 and 16 is an inverse permutation module 18 (in the forward path) and a permutation module 20 (in the feedback path). Permutation module 20 is identical to the permutation module used at the transmitter.

Thus, in a first iteration after receiving a data stream, the output sequence from AZD 14 is processed by inner decoder 14, inverse permutation module 18 (which reverses the permutation inserted at the transmitter) and outer decoder 16. The decoded (and error-corrected) data stream is then processed by permutation module 20 which re-permutes the data stream to the form it had upon arrival at receiver input 12. At the end of a first iteration, the original output sequence from AZD 10 is modified by an error/erasure corrector 22, which incorporates the corrections made in the first pass through the forward path. The second iteration applies the modified AZD output to the above-mentioned receiver blocks, in the same order as in the first iteration. The cyclical decoding procedure repeats.

At each iteration, some of the remaining errors/erasures will be resolved, and error/erasure corrector module 22 modifies the AZD output sequence, by use of a simple logic circuit (or logic table) which substitutes some digits of the AZD sequence with their corrected values. In the first iteration, the error/erasure corrector module 22 plays no role, since the feedback loop provides no information at such time. The iterative procedure ends when all erasures are resolved and no errors are detected, or when no new resolution of error/erasures are achieved, or after a prescribed number of steps (as determined by logic block 24).

At this point there are two options if the decoded sequence contains some unresolved erasures or detectable errors: (1) the receiver can reject the received sequence and ask the transmitter for a retransmission, or (2) the receiver can make "hard" decisions on these digits and deliver the decoded result to data sink 26. This cyclic decoding procedure is hereafter referred to as iterative decoding.

If the channel contains burst errors, the original AZD output will contain errors/erasures in clusters, hence the provision of a permutation module or interleaver module is helpful in enabling correction of some such error conditions. However, even if the channel errors are random, i.e., not bursty, errors/erasures that remain unresolved after a few decoding cycles tend to form clusters. This is because isolated errors/erasures will be the first ones to disappear, and the remaining errors are likely to be the ones that appear in a bunch. The permutation and inverse-permutation in the decoding loop will separate these digits apart, hence the decoders in the next cycle stage can then resolve these isolated errors/erasures.

An Illustrative Example of the Invention

Figure 3:
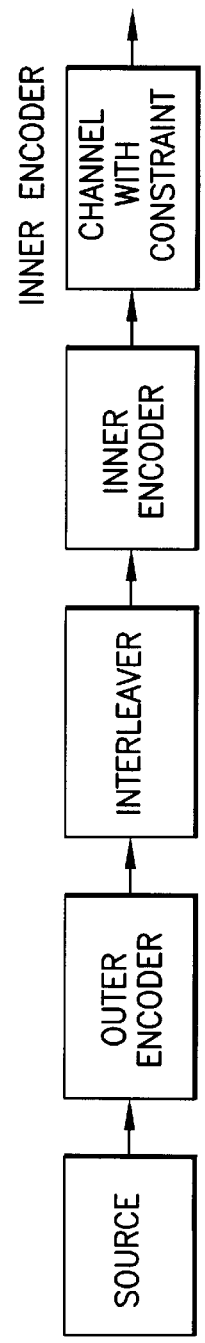
FIG. 3 is a block diagram of a concatenated system for decoding and error correcting a received data stream, wherein the inner encoder is a channel with constraint.
Figure 8:
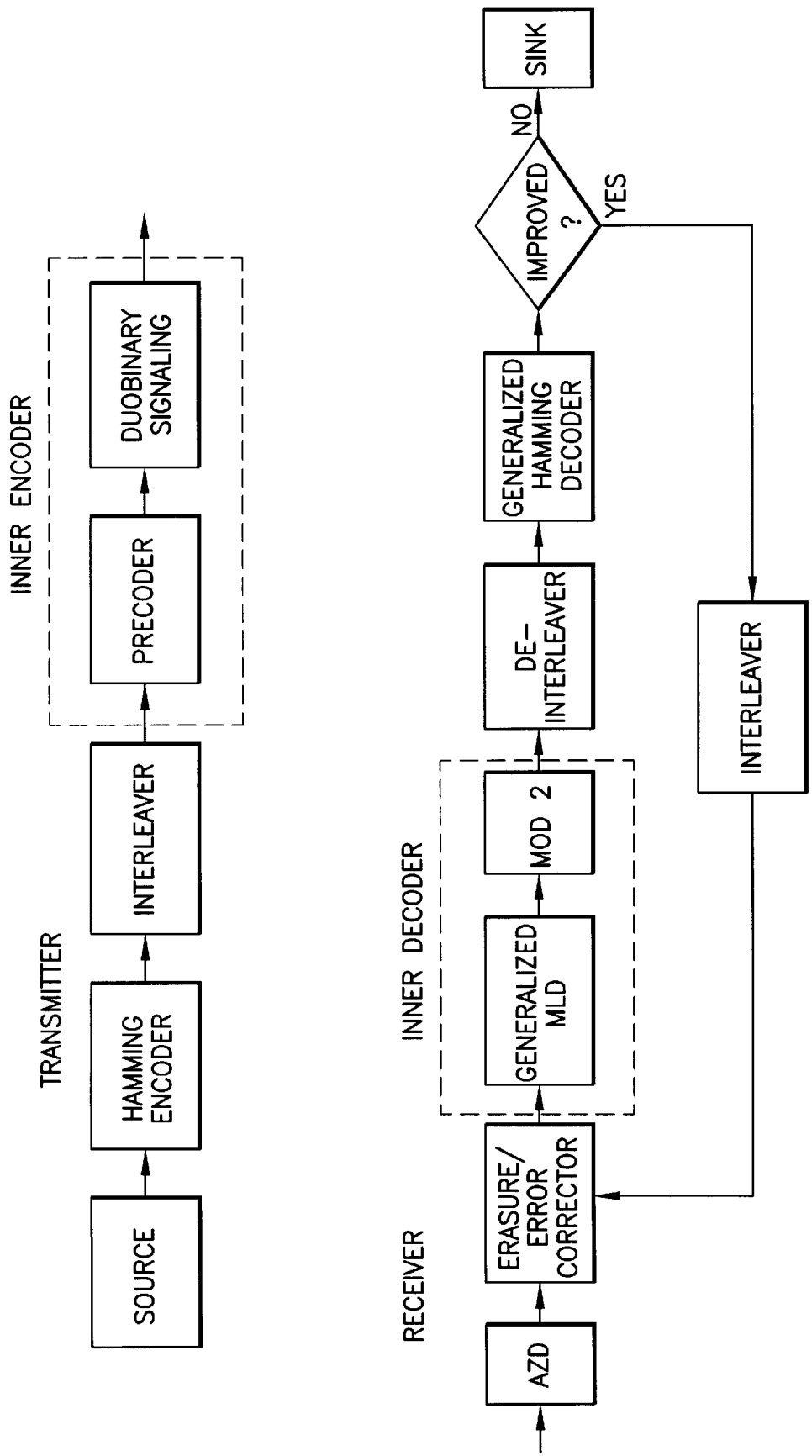
FIG. 8 is a block diagram of the concatenated system of FIGS. 7a and 7b, which system incorporates a Hamming code and duobinary signalling.

It is easiest to explain the invention by way of an example. A concatenated system of the type shown in FIG. 3 is shown in further detail in FIG. 8 which illustrates both the transmission and reception sides. As the outer code, a (7, 4) Hamming code is used and the inner code is duobinary signaling with a precoder. An (n, k) Hamming code is a single error correcting code, which can correct any single error that may exist in a block of bits, consisting of message bits, and parity-check bits (see e.g., Lin/Costello or Peterson/Weldon for details on Hamming codes).

Duobinary signaling is often achieved by sending a binary pulse sequence at a faster rate than is possible in ordinary transmission (see e.g., Bergmans, or any of the aforementioned articles by Kobayashi). When the channel input is binary (0 or 1), then the channel output, sampled at an appropriate rate, should be equivalent to the sum of the present and preceding digits. Thus, the output sequence is a three-level sequence, i.e., 0, 1, or 2. This three-level sequence cannot take on these values independently, because of the nature of its construction. For example, the output sequence should not have direct transitions from 0 to 2 or vice versa. The resultant ternary sequence, called duobinary, is a sequence with some correlation property due to the channel bandwidth constraint.

The precoder introduces a simple transformation prior to the transmission by duobinary signaling. Its purpose is to prevent a possible error propagation in the decoded output. The precoder maps the input binary sequence into another binary sequence, based on the following rule: when the current input is 0, the output should remain in the previous value; and when the input is 1, the output changes its value from the previous one, i.e. either 0 to 1 or from 1 to 0. Precoding of a binary sequence is similar to differential encoding usually used in DPSK (differential phase shift keying). Precoding for multi-level sequences is described in D. T. Tang and H. Kobayashi, "Error-Detecting Techniques for Multilevel Precoded Transmission", U.S. Pat. No. 3,622, 986. Duobinary signaling illustrated in this example is a simplest case of partial-response channel coding referred to in the Background of the Art.

Consider a simple packet transmission system in which there are 28 information bits in a packet, an example of which is given by the stream:

$I_1$=(0001001000110100010101100000)

Rather than encoding the entire packet at once, it is first segmented into blocks of k=4 bits, and each block is then encoded to a codeword of length n=7, by using a (7, 4) Hamming code. Its parity-check and generator matrices are given in systematic form by:

$$H = \begin{pmatrix} 1 & 0 & 1 & 1 & 1 & 0 & 0 \\ 1 & 1 & 1 & 0 & 0 & 1 & 0 \\ 0 & 1 & 1 & 1 & 0 & 0 & 1 \end{pmatrix}$$

and $$G = \begin{pmatrix} 1 & 0 & 0 & 0 & 1 & 1 & 0 \\ 0 & 1 & 0 & 0 & 0 & 1 & 1 \\ 0 & 0 & 1 & 0 & 1 & 1 & 1 \\ 0 & 0 & 0 & 1 & 1 & 0 & 1 \end{pmatrix}$$

Then the Hamming encoder output is the following 49 bits (commas are placed between code words for clarity):

$I_2$=(0001101, 0010111, 0011010, 0100011, 0101110, 0110100, 0000000)

Figure 2:
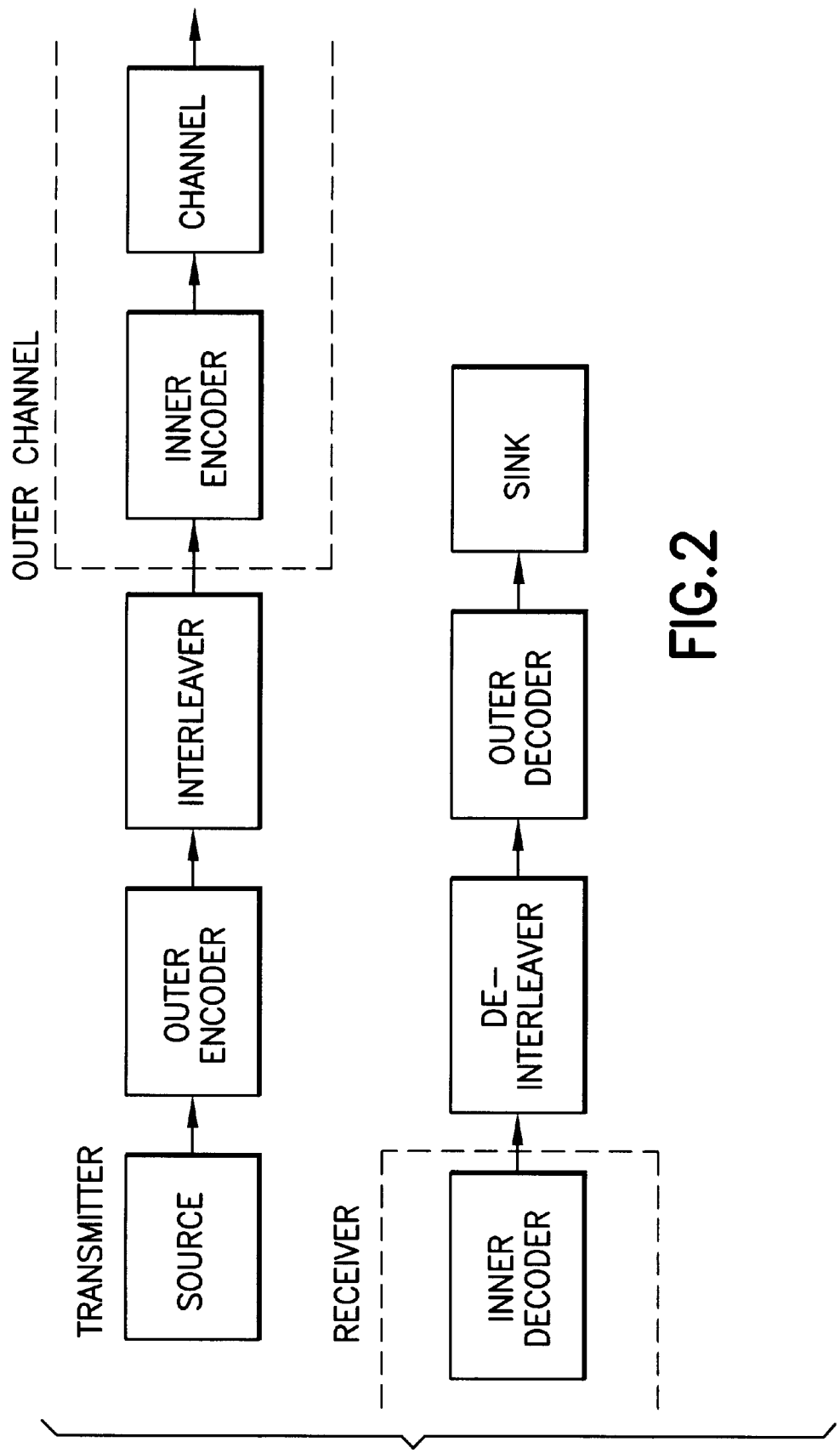
FIG. 2 is a block diagram of a transmitter and receiver in a concatenated system, with interleaving, for decoding and error correcting a received data stream.
Figure 2A:
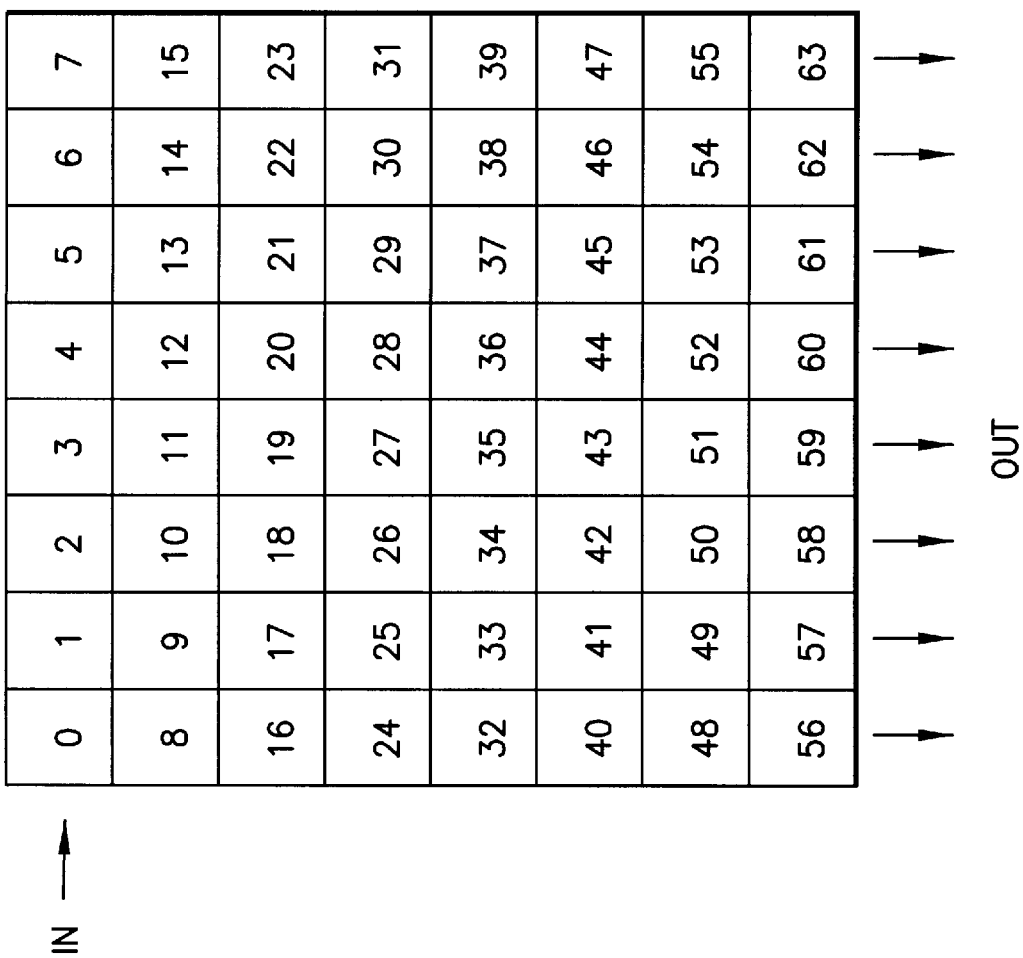
FIG. 2a is a schematic which illustrates an interleaving process.
Figure 4:
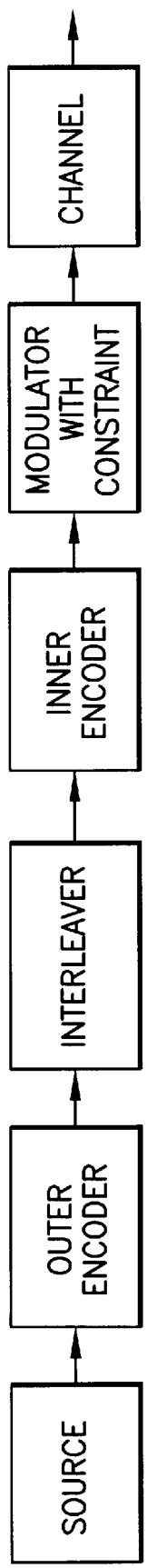
FIG. 4 is a block diagram of a concatenated system for decoding and error correcting a received data stream, wherein the inner encoder is a modulator with constraint.
Figure 5:
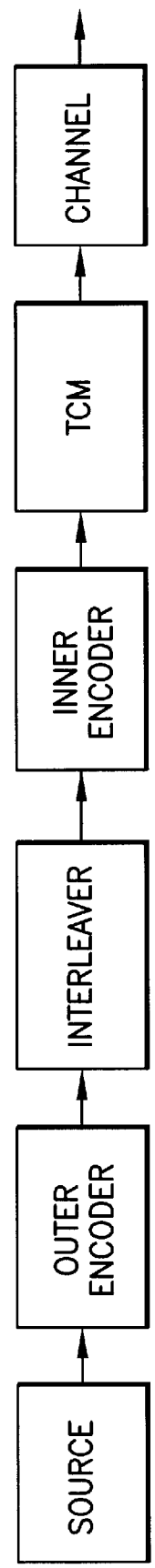
FIG. 5 is a block diagram of a concatenated system for decoding and error correcting a received data stream, wherein the inner encoder is a trellis-coded modulator (TCM).
Figure 6A:
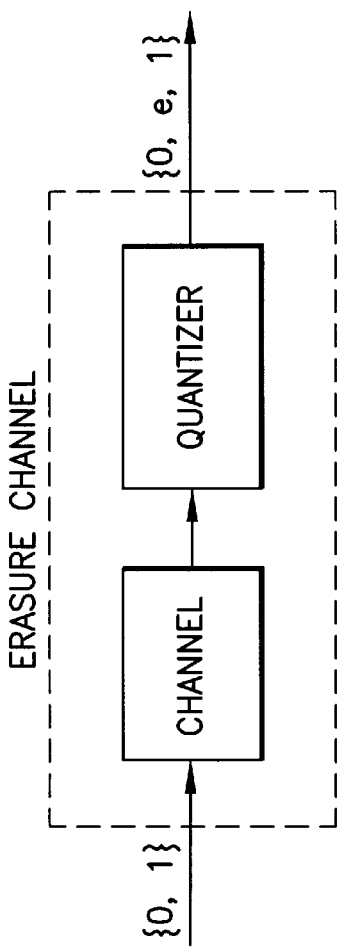
FIG. 6a is a block diagram of a prior art erasure channel.
Figure 6B:
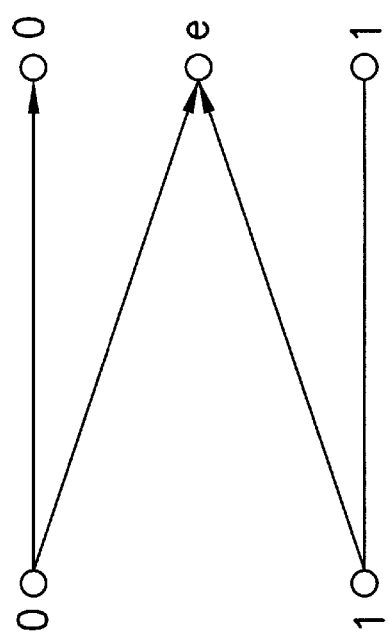
FIG. 6b is a channel transition diagram of the prior art erasure channel.

To perform a permutation action, a 7×7 block interleaver (e.g.,see FIG. 2b) is used which will store the above 49 bits row-wise in the following array structure.

$$\pi = \begin{pmatrix} 0 & 0 & 0 & 1 & 1 & 0 & 1 \\ 0 & 0 & 1 & 0 & 1 & 1 & 1 \\ 0 & 0 & 1 & 1 & 0 & 1 & 0 \\ 0 & 1 & 0 & 0 & 0 & 1 & 1 \\ 0 & 1 & 0 & 1 & 1 & 1 & 0 \\ 0 & 1 & 1 & 0 & 1 & 0 & 0 \\ 0 & 0 & 0 & 0 & 0 & 0 & 0 \end{pmatrix}$$

Then the permutation output is obtained by reading out the above array, column by column as follows:

$I_3$=(0000000, 0001110, 0110010, 1010100, 1100110, 0111100, 1101000).

The precoder output is obtained by taking the modulo-2 sum of the current input and the previous output (where "modulo-2 summation" can be implemented by Exclusive OR: 0+0=0, 0+1=1, 1+0=1, 1+1=0 ):

$I_4$=(0000000, 0001011, 1011100, 1100111, 0111011, 1010111, 011000)

A duobinary sequence which might be observed at the channel output, in the absence of noise, may be given by $I_5$=(0000000, 0001112, 2112210, 1210122, 1122112, 2111122, 1121000)

Figure 9B:
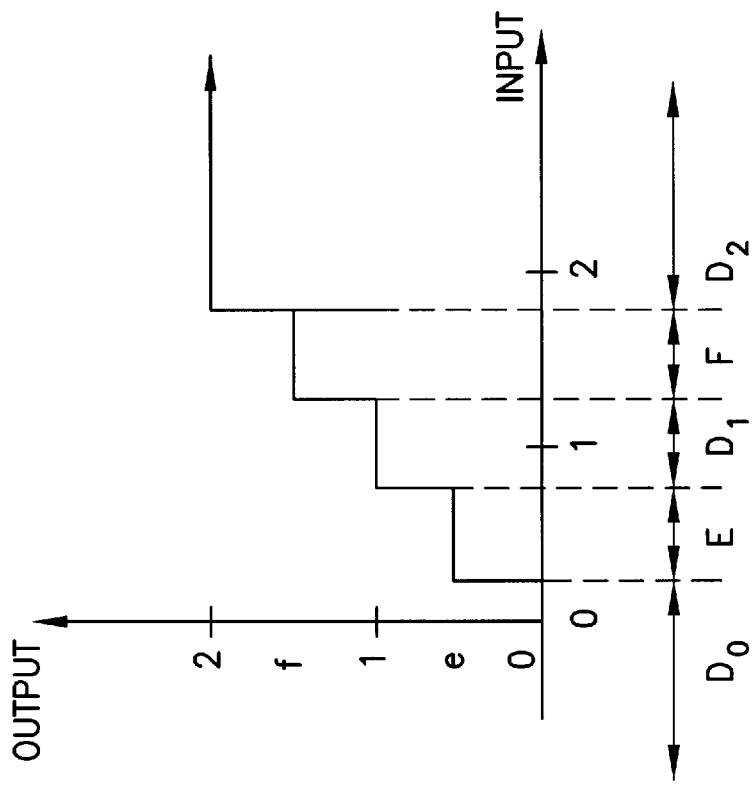
FIG. 9b is a plot of input/output relationship of a quantizer for duobinary signals, in a prior art ambiguity zone detector.
Figure 9A:
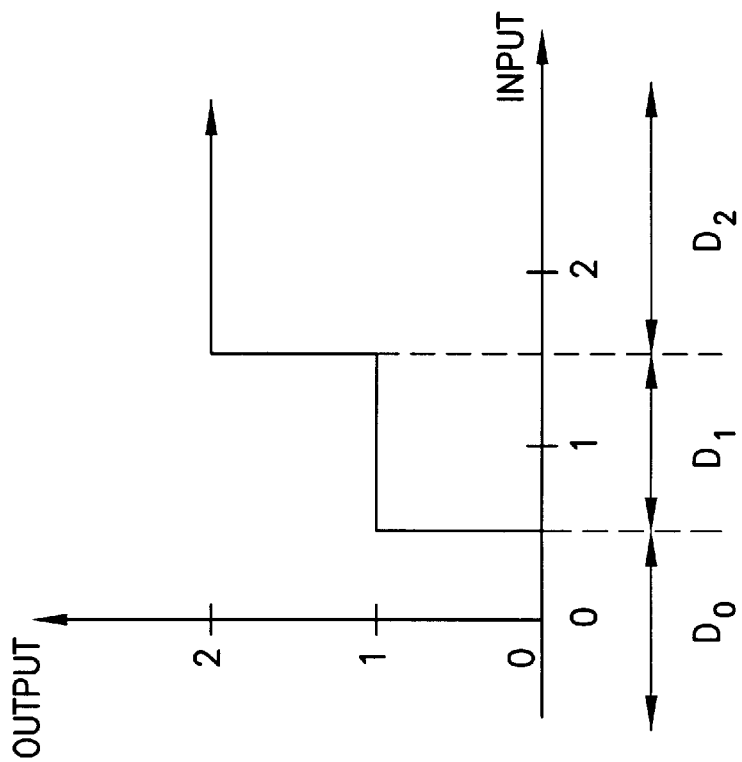
FIG. 9a is a plot of input/output relationship of a quantizer for duobinary signals, in a prior art threshold detector.

Because of channel noise or interference, a received (and sampled) sequence will deviate from the sequence $I_5$. This noisy sequence is passed into an ambiguity zone detector (AZD), whose input and output relation is shown in FIG. 9b, in contrast with an ordinary threshold detector shown in FIG. 9a. When the noise is large, the received sequence may fall in ambiguity zones E or F. The AZD outputs are labeled as e or f, respectively. The symbols e and f are called "generalized erasures". The AZD output, therefore, has five levels {0, e, 1, f, 2}. In actual implementation, these values may be represented by {0, 0.5, 1, 1.5, 2} or a three bit representation may be used, e.g., {(000), (001), (010), (011), (100)}, or any similar representation.

In general, an AZD increases the quantization level by L-1, where L is the number of legitimate channel output levels (e.g., L=3 in the duobinary signal). This modest increase in the quantization level (hence one or a few additional bits required per digit) is advantageous to the conventional "soft-decision" quantizer which represents the received sequence in several-to-many bits per digit.

Suppose that the AZD output is given by:

$I_6$=(00e00ee, 00ee112, f11ff10, 1ffe122, 1eff112, 21ef122, ff21e00).

For simplicity it is assumed that no errors are made by the AZD processing. In other words, the ambiguity zones are set wide enough to capture all the noisy data. The invention is applicable to cases where the AZD output may contain errors as well as erasures. Existence of errors in the AZD output does not affect the principle of the iterative decoding procedure. It is simply a matter of added complexity in the decoder implementation.

The above AZD output is then fed to the decoder that attempts to resolve as many erasures/errors as possible. A "generalized maximum likelihood decoder" (MLD) is used in this example. An MLD for a partial-response channel is described in the aforementioned articles by H. Kobayashi, and is now widely known as a PRML (partial-response, maximum-likelihood) decoder (see e.g., Bergmans). The generalized MLD accepts a five-valued AZD sequence and produces also a five-value sequence, although the latter contains fewer e's and f's. This contrasts with a conventional MLD (often called a Viterbi decoder) that produces a 0–1 sequence at the decoder output in the one-path decoding algorithm.

In the present case, the generalized MLD can correct all isolated erasures and some consecutive erasures as shown below.

$I_7$=(00000ee, 0001112, f11ff10, 1ffe122, 1eff112, 2111122, ff21000, where the digits obtained by resolving erasures are shown in bold face.

A mod-2 operation is then applied to the above sequence, whereby any 2 is replaced by 0 (i.e., 2=0 modulo 2). The erasures e and f are retained. Hence, the resultant sequence takes four value {0, e, 1, f} which can now be represented in two bits instead of three bits, if necessary.

$I_8$=(00000ee, 0001110, f11ff10, 1ffe100, 1eff110, 0111100, ff01000),

The generalized MLD and the mod-2 decoder can be combined in an actual implementation, producing $I_8$ directly from $I_6$. The MLD and the mod-2 decoder are shown separately in order to clarify the decoding step.

Next, an inverse permutation (i.e., 7×7 de-interleaver) is applied. This can be performed in the same manner as the interleaving is performed at the transmitter. The only difference is that the data is written-in vertically, and is read-out horizontally:

$$\pi^{-1} = \begin{matrix} 0 & 0 & f & 1 & 1 & 0 & f \\ 0 & 0 & 1 & f & e & 1 & f \\ 0 & 0 & 1 & f & f & 1 & 0 \\ 0 & 1 & f & e & f & 1 & 1 \\ 0 & 1 & f & 1 & 1 & 1 & 0 \\ e & 1 & 1 & 0 & 1 & 0 & 0 \\ e & 0 & 0 & 0 & 0 & 0 & 0 \end{matrix}$$

The output of the de-interleaver is therefore given by $I_9$=(00f110f, 001felf, 001ff10, 01fef11, 01f1110, e110100, e000000).

The above sequence is then passed into a "generalized Hamming decoder". The decoder receives the input with erasures, and corrects some errors and/or resolve some erasures. It is different from the ordinary Hamming decoder in the sense that the unresolved erasures are retained for further processing. Similarly unlike a conventional decoder, the check (i.e., parity) bits are not thrown away until the iterations are completed.

The generalized Hamming decoder can be constructed by modifying a "syndrome-based decoder" (see e.g., Lin/Costello, Peterson/Weldon for the conventional syndrome-based decoder), or by creating a decoding table. For this example, a majority of remaining errors and erasures contained in I9 can be corrected, obtaining $I_{10}$=(0001101, 001felf, 0011010, 1100011, 0101110, 0110100, 0000000)

At the end of the first iteration, a permutation action is performed. This can be done by writing the seven blocks of $I_{10}$ row-wise, and creating the following array:

$$\pi' = \begin{matrix} 0 & 0 & 0 & 1 & 1 & 0 & 1 \\ 0 & 0 & 1 & f & e & 1 & f \\ 0 & 0 & 1 & 1 & 0 & 1 & 0 \\ 0 & 1 & 0 & 0 & 0 & 1 & 1 \\ 0 & 1 & 0 & 1 & 1 & 1 & 0 \\ 0 & 1 & 1 & 0 & 1 & 0 & 0 \\ 0 & 0 & 0 & 0 & 0 & 0 & 0 \end{matrix}$$

The permutation output is obtained by reading out the above array column by column, yielding:

$I_{11}$=(0000000, 0001110, 0110010, 1f10100, 1e00110, 0111100, 1f01000)

Note that the array $\pi'$ can share the memory space (or registers) used by the array $\pi^{-1}$, since the contents of these arrays are not retained once they are read out.

The error/erasure corrector module compares the original AZD output $I_6$ and the above $I_{11}$, and replace some of the errors/erasures in $I_6$ by their correct values, yielding $I_{12}$ shown below.

$I_{12}$=(0000000, 0001112, 2112210, 1f10122, 1e22112, 2111122, 1f21000).

Note that the string $I_{11}$ is a binary sequence, whereas $I_{12}$, like $I_6$ is a duobinary sequence with some erasures. So if some digit in $I_{11}$ is 0 (i.e., just corrected in the latest iteration), then the corresponding e in $I_{12}$ should be replaced by 0, and f by 1. Similarly, if some digit in $I_{11}$ is 1, then the corresponding erasure (whether e or f ) in $I_{12}$ should be changed to 1.

The second iteration of decoding starts with the sequence $I_{12}$, which contains fewer errors/erasures than the original AZD output $I_6$. This will make the subsequent decoding task simpler, hence will help the second iteration to further reduce the remaining errors/erasures. With 12 as the new input, the generalized MLD can correct, in this particular instance, all the remaining erasures, obtaining $I_{13}$=(0000000, 0001112, 2112210, 1210122, 1122112, 2111122, 1121000).

Then a mod-2 operation is applied to $I_{13}$ (as was done to $I_7$ in the first iteration), obtaining $I_{14}$=(0000000, 0001110, 0110010, 1010100, 1100110, 0111100, 1101000), which is the same as $I_3$.

Next, the 49 bits are written into the de-interleaver array column-wise:

$$\pi^{-1} = \begin{matrix} 0 & 0 & 0 & 1 & 1 & 0 & 1 \\ 0 & 0 & 1 & 0 & 1 & 1 & 1 \\ 0 & 0 & 1 & 1 & 0 & 1 & 1 \\ 0 & 1 & 0 & 0 & 0 & 1 & 1 \\ 0 & 1 & 0 & 1 & 1 & 1 & 0 \\ 0 & 1 & 1 & 0 & 1 & 0 & 0 \\ 0 & 0 & 0 & 0 & 0 & 0 & 0 \end{matrix}$$

The bits are then read out row-wise, to obtain a binary sequence:

$I_{15}$=(0001101, 0010111, 0011010, 0100011, 0101110, 0110100, 0000000)

which is identical to $I_2$, as it should be. Therefore, all the erasures have been resolved even before the second iteration is completed.

The Hamming decoder checks the above sequence, block-by-block (by either "syndrome calculations" or by "table look-up"), and confirms that there are no errors. By deleting the last 3 bits (parity-check bits) in each block of 7 bits, the final decoded output is obtained:

$I_{16}$=(0001, 0010, 0010, 0100, 0101, 0110, 0000)

Hence the iterative decoder has successfully recovered the original information sequence of length 28 bits, and delivers it to the data sink or the end user. Should AZD output $I_6$ start with more erasures/errors, it would take more than two iterations to complete.

In the above description it has been assumed that the information source is binary data. The invention can also be applied to a non-binary system. For instance, a Reed-Solomon code can be used as an error correcting code instead of Hamming or BCH codes.

Partial-response channel coding can be also employ multi-level signals, as discussed in the aforementioned US patent by Tang/Kobayashi. Use of QAM (quadrature amplitude modulation), PSK (phase shift keying) or MSK (minimum shift keying) creates an equivalent baseband system with non-binary symbols.

In the above description, an ambiguity zone between adjacent legitimate values was considered. If the information is in L possible amplitudes of received sequence (as in the partial-response system), the number of ambiguity zones (hence the number of distinct erasure symbols) is L-1. In case of a phase modulation system with L discrete phase values, then the number of ambiguity zones is also L. FIG. 10a shows an example of 4-phase modulation, where $\phi 1$, $\phi 2$, $\phi 3$ and $\phi 4$ show legitimate phases. Regions $D_1$, $D_2$, $D_3$ and $D_4$ are decision regions for these phase values, and regions $R_{12}$, $R_{23}$, $R_{34}$ and $R_{41}$ are ambiguity zones to be used by the AZD. A signal value that falls in any of these zones will be labeled by one of the erasure symbols, say $e_{12}$, $e_{23}$, $e_{34}$ or $e_{41}$. When the modulation scheme combines both amplitude and phase, then partitioning of the signal space into decision regions and ambiguity zones can be defined appropriately in the two-dimensional signal space.

More than one ambiguity zone can be assigned between a pair of legitimate values. For instance FIG. 10b shows a case where the ambiguity zones are subdivided into eight, $R_1+$, $R_2-$, $R_2+$, . . . , $R_4+$, $R_1-$. This finer ambiguity zone assignment is especially useful when a concatenated system is considered with more than two encoders, as described below.

In the example presented, the result of a previous iteration is reflected by upgrading the AZD output sequence at the "error/erasure corrector". This simple comparison and substitution digit-by-digit is possible for the partial-response system, since a correctly decoded bit affects only one AZD digit position, due to the precoder's property. When the precoder is not adopted, or an appropriate precoder does not exist, as for a convolutional code, the "error/erasure corrector" function is incorporated into the inner decoder. In other words, the correctly decoded bit should be used to improve the inner decoder operation, instead of improving its input sequence. This improvement is possible, because the correct bit information made available will help the decoder select a correct "surviving path" among many contenders, in maximum likelihood decoding.

In the discussion above, only concatenated systems with two encoders have been discussed (i.e., the inner and outer encoders) at the transmitter and the corresponding two decoders at the receiver. The invention can be extended to a concatenated system with three or more encoders. An example of such a concatenation is one which contains a product encoder, followed by a partial-response channel (or a runlength-limited coder), as is often found in a digital storage system. As indicated above, a product code is by itself equivalent to a concatenated code with an interleaver in-between.

Figure 11C:
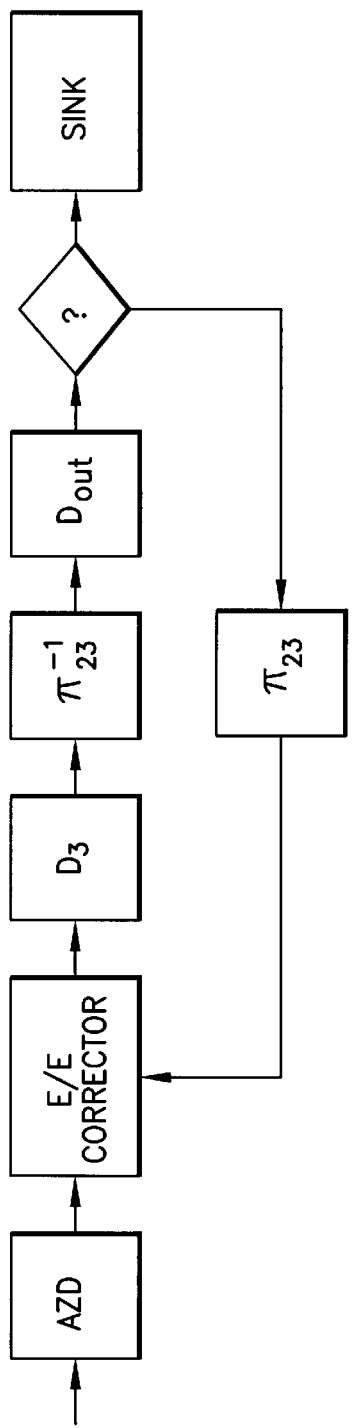
FIG. 11c is a block diagram of a concatenated system employing an iterative encoder for the equivalent two encoder system of FIG. 11b.
Figure 11D:
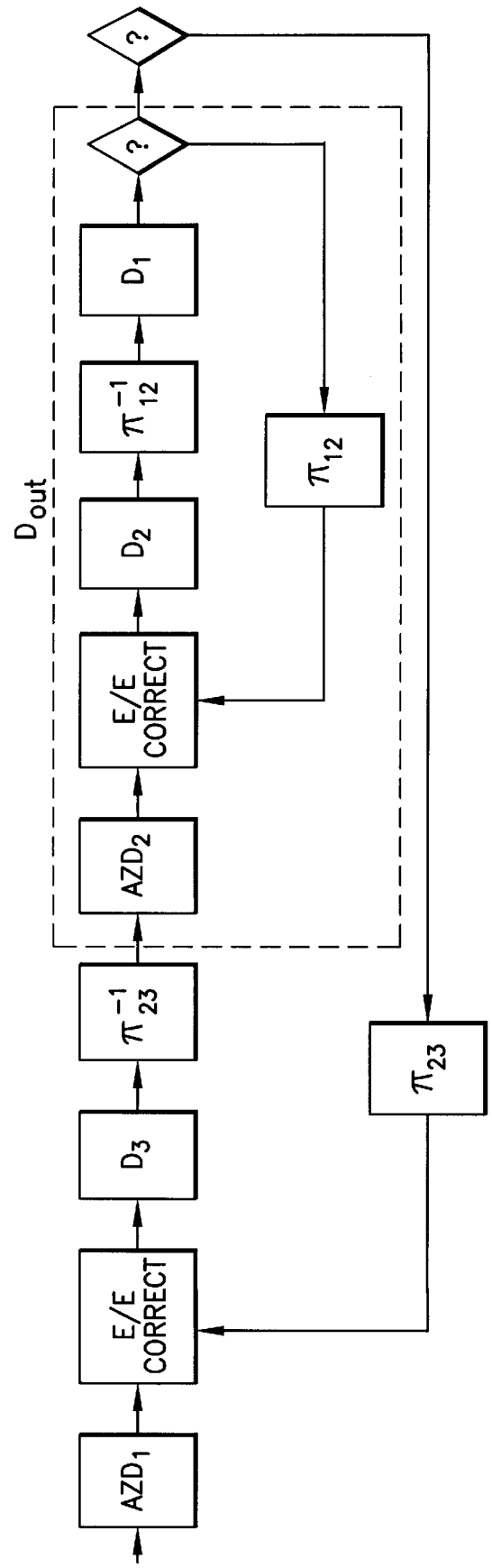

Consider, for instance, the concatenated coding system shown in FIG. 11a, where $E_1$, $E_2$ and $E_3$ are encoders, and $\pi_{12}$ and $\pi_{23}$ are permutations. One way to derive the iterative decoding structure described above is to form a subsystem, which can be termed an "outer encoder" $E_{out}$, including $E_1$, $\pi_{12}$ and $E_2$. The remaining subsystem, called an "outer channel" includes $\pi_{23}$, $E_3$ and the channel, as shown in FIG. 11b. This system is a two concatenated system where $E_3$ is the inner encoder and having permutation $\pi_{23}$ between the outer encoder and this inner encoder. This observation readily leads to the iterative decoding system shown in FIG. 11c, where $D_{out}$ is the decoder for the outer encoder $E_{out}$. Since the $E_{out}$ itself is a two-concatenated system, $D_{out}$ itself is a two-concatenated decoder. Thus, a decoding system is obtained as shown in FIG. 11d. Note that the quantization by $AZD_2$ may be more coarse than $AZD_1$, or $AZD_2$ may not exist. Such a decision depends on the particular structure of the encoders, and cost/performance tradeoffs of the decoder.

Figure 12A:
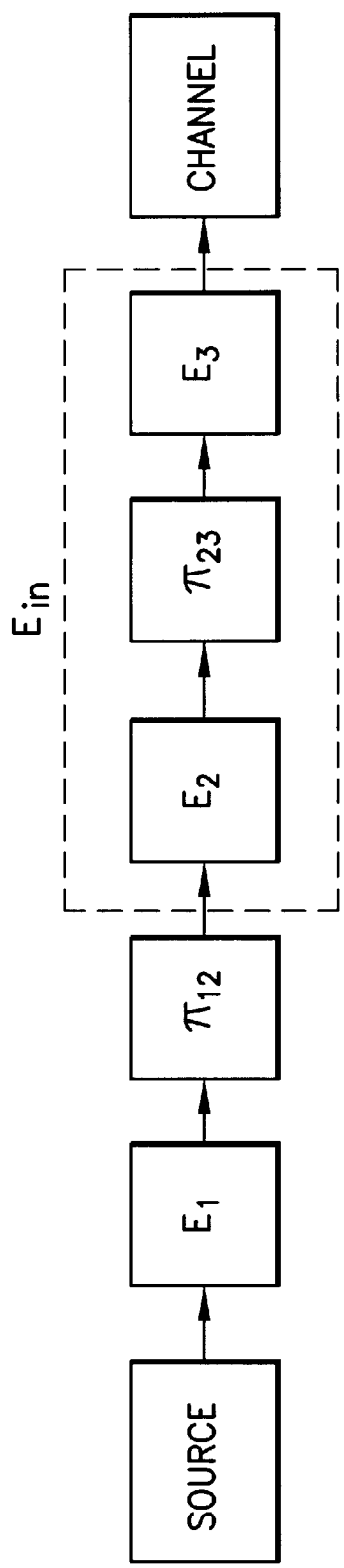
Figure 12B:
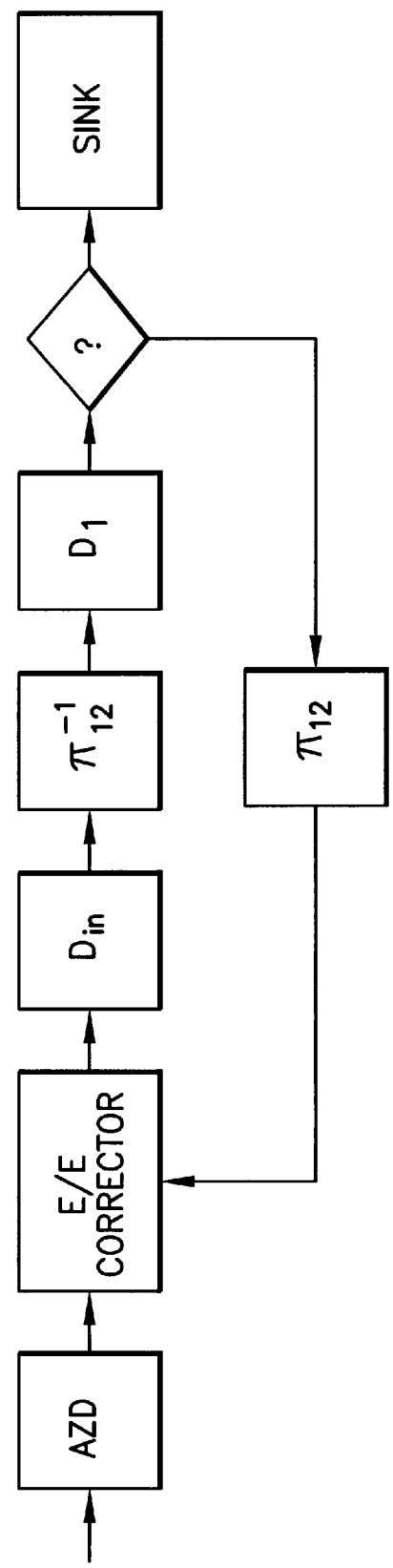

Another way to derive an iterative decoder for the system FIG. 11a is to combine $E_2$, $\pi_{23}$ and $E_3$ to form an inner encoder $E_{in}$, as shown in FIG. 12a. Such grouping may be appropriate, for example, when $E_1$ is a block encoder, and $E_2$ is a convolutional encoder, and $E_3$ is a modulator with a constraint. Trellis coded modulation (TCM) corresponds to the case where $E_2$ is a convolutional encoder, $E_3$ is a phase modulator with constraint, and the permutation $\pi_{23}$ can be included as part of a set-partitioning rule used in TCM.) Then $E_1$ (an outer encoder by itself) and Bin form a two-concatenated system. The decoder structure of FIG. 11b is then obtained, where $D_{in}$ is the decoder for $E_{in}$. By applying the similar argument as above, the structure $D_{in}$, can be expanded, to obtain the overall decoder of FIG. 12c.

In either case the iterative loops are nested. That means in each iteration of an outer loop there will be several iterations along the inner loop.

A third type of decoding scheme is shown in FIG. 13, where a single feedback loop is formed and the erasure/error correction is incorporated in actual decoders $D_1$, $D_2$ and $D_3$.

Figure 14A:
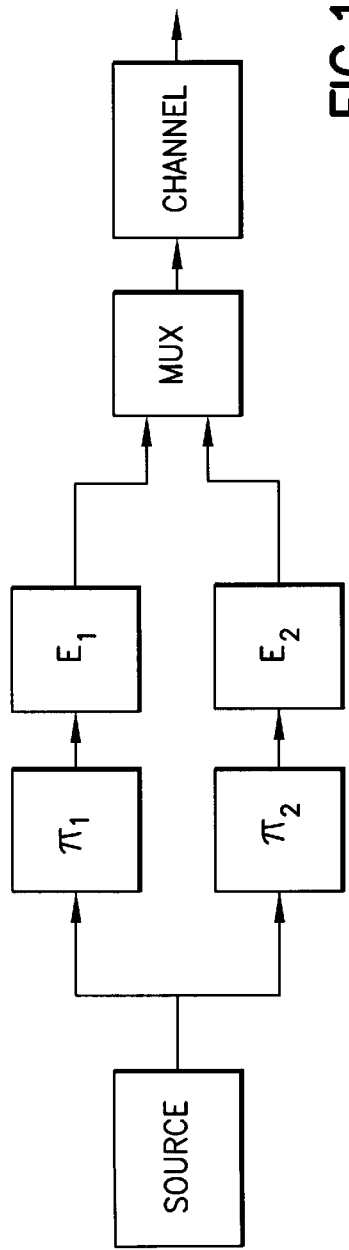
FIG. 14a is a block diagram of a two-parallel concatenated system incorporating the invention.

The iterative decoding with AZD procedure described above can be generalized to a case where a parallel concatenation is adopted at the transmitter side. An example of such a system is a new class of codes, called Turbo codes (see e.g., Berroeux, A., "Near Optimum Error Correcting Coding and Decoding: Turbo Codes", IEEE Transactions on Communications, October 1996, pp. 1261–1271). FIG. 14a depicts such a system, where an information sequence I from a source is first passed into two parallel permutations $\pi_1$ and $\pi_2$, which are then encoded by encoders $E_1$ and $E_2$. The encoded messages are then multiplexed and sent over a channel.

Figure 14B:
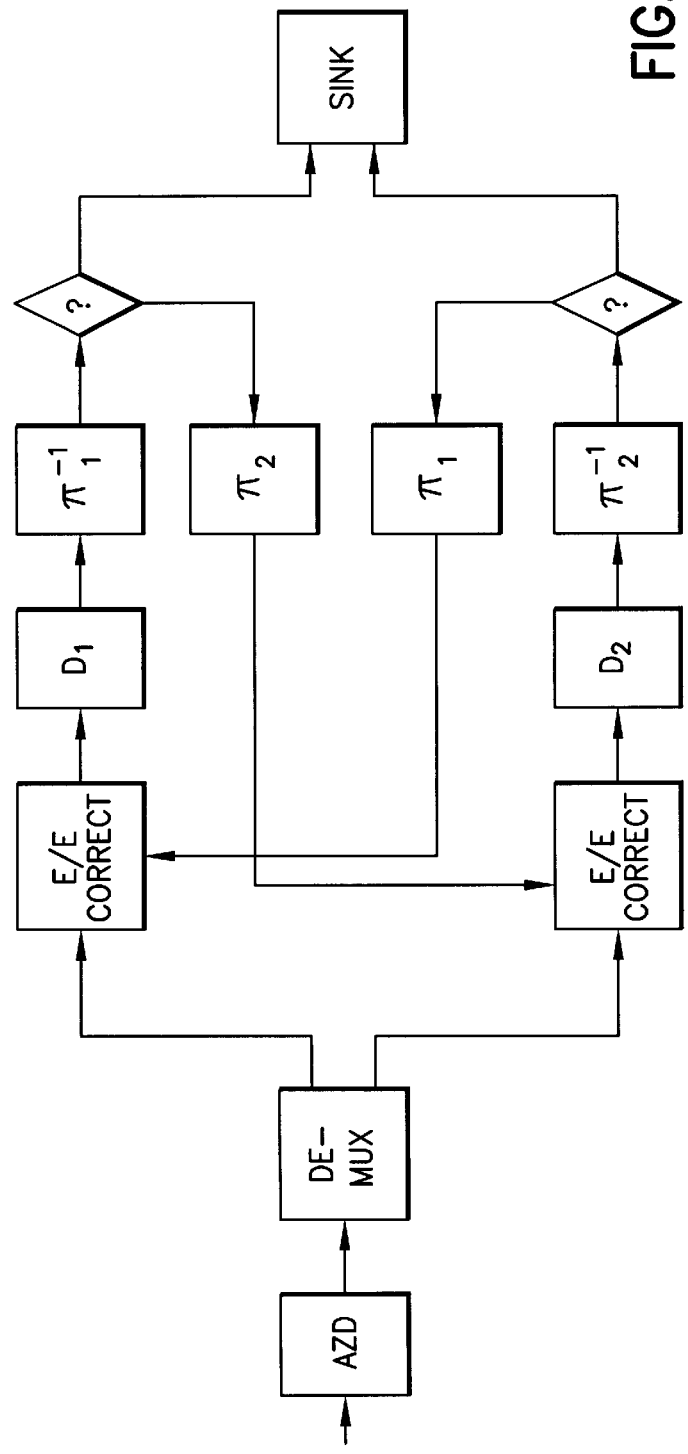

The corresponding decoder is shown in FIG. 14b. The incoming data stream first passes AZD, and then is demultiplexed to generate two parallel streams. The upper stream is a noisy version of the output of $E_1$, and the lower stream is a noisy version of the $E_2$ output. Iterative decoding is then performed by allowing lower decoder $D_2$ to use I as an estimate of I generated by upper decoder $D_1$. The lower decoder then generates a new (and presumably better) estimate of the information, denoted I, and this will be fed back to the upper decoder. With this new information the upper decoder will produce a better estimate than its previous I. This can be fed again to the lower decoder, and so forth. The iteration steps should end when all erasures are resolved, or no further improvement is achieved.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for error correcting a received data stream which has been subjected to plural concatenated entities which have encoded said data stream or subjected said data stream to a constraint, said method comprising the steps of:
    a) sampling signals in said received data stream and assigning discrete data values to sampled signals falling in non-ambiguous amplitude or phase ranges, and assigning ambiguity symbols to sampled signals falling within an ambiguity range of amplitude or phase values, and outputting a quantized data stream comprising said discrete data values and ambiguity symbols;
    b) decoding and error correcting data values making up said quantized data stream to create an error-corrected data stream, said decoding comprising plural decoding actions for decoding data that has been encoded or subjected to a constraint by said plural concatenated entities;
    c) modifying data values and ambiguity symbols in said quantized data stream through substitution of corrected data values from said error corrected data stream into corresponding data values in said quantized data stream, to thereby create a revised data stream; and
    d) iteratively subjecting said revised data stream, both as is and as further revised, to steps b) and c) to improve an error correction state of said revised data stream.

2. The method as recited in claim 1, wherein data in said received data stream has been subjected to a permutation action to time-wise separate originally contiguous data values existing in a data stream which gave rise to said received data stream, and wherein step b) further subjects said quantized data stream to an inverse permutation action in producing said error-corrected data stream, and wherein step c) subjects said error-corrected data stream to said permutation action to return said error-corrected data stream to a format identical to that of said quantized data stream before said substitution is performed.

3. The method as recited in claim 2, wherein said permutation action results in an interleaving of said received data stream and said error-corrected data stream.

4. The method as recited in claim 1, wherein step d) is repeated until it is determined that said revised data stream is not being further error corrected.

5. The method as recited in claim 1, wherein said received data stream includes parity data values that are added for error detection and correction purposes, said parity data values and any ambiguity values corresponding thereto being retained, and subject to correction, during steps a)–d).

6. The method as recited in claim 1, wherein step b) comprises plural decoding actions for performing decoding of data that has been encoded by different encoding algorithms.

7. A receiver/decoder for error correcting a received data stream which has been subjected to plural concatenated entities which have encoded said data stream or subjected said data stream to a constraint, comprising:
    a) detector means for sampling signals in said received data stream and assigning discrete data values to sampled signals falling in non-ambiguous amplitude or phase ranges and for assigning ambiguity symbols to sampled signals falling within an ambiguity range of amplitude or phase values, and for outputting a quantized data stream comprising said discrete data values and said ambiguity symbols;
    b) decoder means for decoding and error correcting data values making up said quantized data stream to create an error-corrected data stream, said decoding comprising plural decoding actions for decoding data that has been encoded or subjected to a constraint by said plural concatenated entities;
    c) feedback error correction means coupled between said decoder means and said detector means and receiving a form of said error-corrected data stream from an output of said decoder means, for modifying data values and ambiguity symbols in said quantized data stream through substitution of corrected data values from said error corrected data stream into corresponding data values in said quantized data stream, to thereby create a revised data stream; and
    d) control means for iteratively causing said decoder means and said feedback error correction means to operate upon said revised data stream, both as is and as further revised, to improve an error correction state of said revised data stream.

8. The receiver/decoder as recited in claim 7, wherein data in said received data stream has been subjected to a permutation action to time-wise separate originally contiguous data values existing in a data stream which gave rise to said received data stream, and wherein said decoder further subjects said quantized data stream to an inverse permutation action in producing said error-corrected data stream, and wherein said feedback error correction means subjects said error-corrected data stream to said permutation action to return said error-corrected data stream to a format identical to that of said quantized data stream before said substitution is performed.

9. The receiver/decoder as recited in claim 8, wherein said permutation action results in an interleaving of said received data stream and said error-corrected data stream.

10. The receiver/decoder as recited in claim 7, wherein said control means causes a repetition of action of said decoder means and said feedback error correction means until said control means determine that said revised data stream is not being further error corrected.

11. The receiver/decoder as recited in claim 7, wherein said received data stream includes parity data values that are added for error detection and correction purposes, said parity data values and any ambiguity values corresponding thereto being retained, and subject to correction during action of each of the means recited in claim 7.

12. The receiver/decoder as recited in claim 7, wherein said decoder means comprises plural decoders for performing decoding of data that has been encoded by different encoding algorithms.

* * * * *

UNITED STATES PATENT AND TRADEMARK OFFICE
CERTIFICATE OF CORRECTION

PATENT NO.    : 6,029,264                                        Page 1 of 1
DATED         : February 22, 2000
INVENTOR(S)   : Hisashi Kabayashi et al.

It is certified that error appears in the above-identified patent and that said Letters Patent is hereby corrected as shown below:

Column 1,
Line 1, include the following statement at the beginning of the application:

The U.S. Government has a paid-up license in this invention and the right in limited circumstances to require the patent owner to license others on reasonable terms as provided for by the terms of DARPA # F19628-94-C0045 P 00002, awarded by Defense Advanced Research Projects Agency, and DOD #F49620-95-10532, awarded by the Department of Defense.

Signed and Sealed this

Fifth Day of February, 2002

*Attest:*

JAMES E. ROGAN
*Attesting Officer*      *Director of the United States Patent and Trademark Office*